United States Patent
Yokosuka et al.

(10) Patent No.: US 11,211,226 B2
(45) Date of Patent: Dec. 28, 2021

(54) PATTERN CROSS-SECTIONAL SHAPE ESTIMATION SYSTEM AND PROGRAM

(71) Applicant: Hitachi High-Tech Corporation, Tokyo (JP)

(72) Inventors: Toshiyuki Yokosuka, Tokyo (JP); Hirohiko Kitsuki, Tokyo (JP); Daisuke Bizen, Tokyo (JP); Makoto Suzuki, Tokyo (JP); Yusuke Abe, Tokyo (JP); Kenji Yasui, Tokyo (JP); Mayuka Osaki, Tokyo (JP); Hideyuki Kazumi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/810,969

(22) Filed: Mar. 6, 2020

(65) Prior Publication Data

US 2020/0321189 A1 Oct. 8, 2020

(30) Foreign Application Priority Data

Apr. 8, 2019 (JP) .............................. JP2019-073517

(51) Int. Cl.
*H01J 37/28* (2006.01)
*H01J 37/22* (2006.01)
*H01J 37/244* (2006.01)

(52) U.S. Cl.
CPC ............ *H01J 37/28* (2013.01); *H01J 37/222* (2013.01); *H01J 37/244* (2013.01); *H01J 2237/2817* (2013.01)

(58) Field of Classification Search
USPC ....................................................... 250/311
See application file for complete search history.

(56) References Cited

U.S. PATENT DOCUMENTS

| 5,412,210 A * | 5/1995 | Todokoro | ............... G01B 15/04 250/306 |
| 7,807,980 B2 * | 10/2010 | Shishido | ............... H01J 37/265 250/492.1 |

(Continued)

FOREIGN PATENT DOCUMENTS

| JP | 62-261911 A | 11/1987 |
| JP | 2011-033423 A | 2/2011 |

(Continued)

OTHER PUBLICATIONS

Burns; "Angular Distribution of Secondary Electrons from (100) Faces of Copper and Nickel" Physical Review vol. 119, No. 1, Jul. 1960, pp. 102-114. (Year: 1960).*

(Continued)

*Primary Examiner* — Phillip A Johnston
(74) *Attorney, Agent, or Firm* — Mattingly & Malur, PC

(57) ABSTRACT

The present disclosure provides a pattern cross-sectional shape estimation system which includes a charged particle ray device which includes a scanning deflector that scans a charged particle beam, a detector that detects charged particles, and an angle discriminator that is disposed in a front stage of the detector and discriminates charged particles to be detected, and an arithmetic device that generates a luminance of an image, and calculates a signal waveform of a designated region on the image using the luminance. The arithmetic device generates angle discrimination images using signal electrons at different detection angles, and estimates a side wall shape of a measurement target pattern.

5 Claims, 9 Drawing Sheets

(56) References Cited

U.S. PATENT DOCUMENTS

| | | | |
|---|---|---|---|
| 8,530,837 B2* | 9/2013 | Adamec | H01J 37/244 250/310 |
| 9,786,468 B2* | 10/2017 | Yokosuka | H01J 37/22 |
| 11,133,147 B2* | 9/2021 | Yokosuka | H01J 37/244 |
| 2007/0114398 A1 | 5/2007 | Miyamoto et al. | |
| 2009/0212215 A1* | 8/2009 | Nagatomo | G01N 23/225 250/311 |
| 2012/0126116 A1* | 5/2012 | Tanaka | G01B 15/04 250/307 |
| 2012/0261573 A1 | 10/2012 | Adamec | |
| 2015/0357154 A1 | 12/2015 | Yokosuka et al. | |
| 2016/0379798 A1 | 12/2016 | Shishido et al. | |
| 2018/0182595 A1 | 6/2018 | Yokosuka et al. | |

FOREIGN PATENT DOCUMENTS

| | | |
|---|---|---|
| JP | 2013-069693 A | 4/2013 |
| JP | 2015-106530 A | 6/2015 |
| JP | 5791028 B2 | 10/2015 |
| JP | 2017-062174 A | 3/2017 |
| KR | 10-1724221 B1 | 4/2017 |

OTHER PUBLICATIONS

Korean Office Action mailed in corresponding Korean Application No. 10-2020-0030651 dated Aug. 6, 2021.

* cited by examiner

FIG. 9A
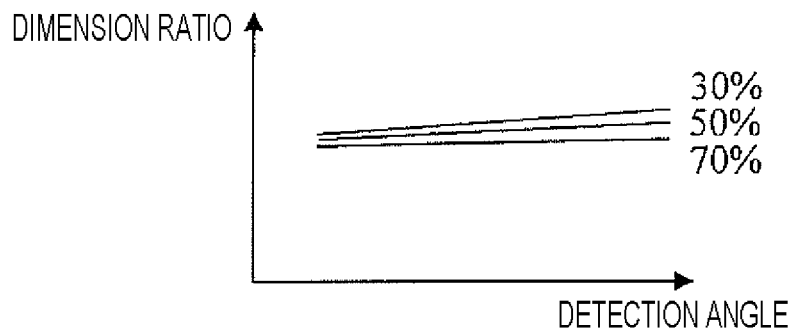
FIG. 9B
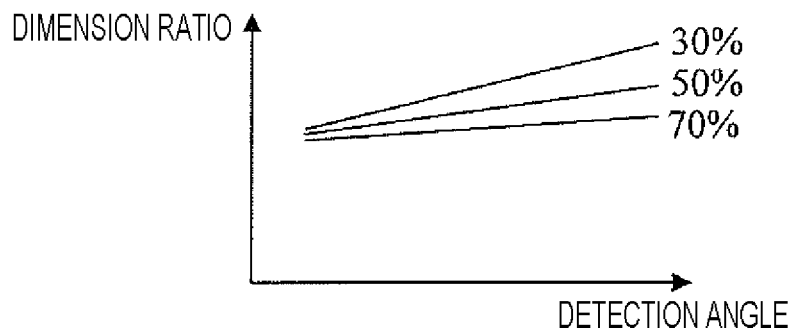
FIG. 9C
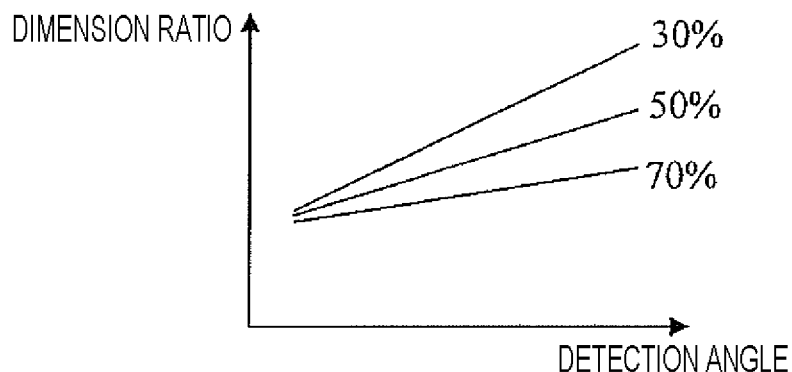
FIG. 10A  FIG. 10B  FIG. 10C
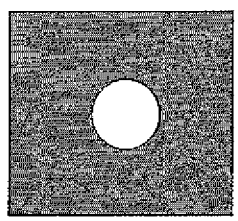 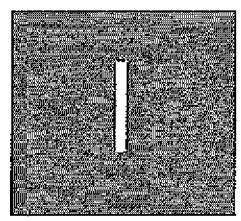 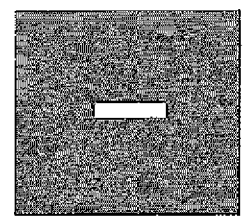

PATTERN CROSS-SECTIONAL SHAPE ESTIMATION SYSTEM AND PROGRAM

CROSS-REFERENCE TO RELATED APPLICATION

The present application claims priority from Japanese application JP2019-073517, filed on Apr. 8, 2019, the contents of which is hereby incorporated by reference into this application.

BACKGROUND OF THE INVENTION

1. Field of the Invention

The present disclosure relates to a pattern cross-sectional shape estimation system and a program.

2. Description of the Related Art

With miniaturization and high integration of semiconductor patterns, a slight difference in shape has an influence on the operation characteristics of the device, and the need for shape management is increasing. Therefore, a scanning electron microscope (SEM: Scanning Electron Microscope) used for semiconductor inspection/measurement is required to have higher sensitivity and higher accuracy than ever before.

In recent years, along with the miniaturization of patterns and the development of high aspect ratios in which devices are stacked in the height direction, the need for measurement of three-dimensional structures is increasing. In addition, as the pattern size becomes finer, the influence of the shape of the pattern side wall on the device characteristics increases, and the need for inspection and measurement is increasing. The side wall shape of the pattern is usually divided into wafers, and a sample for cross-sectional observation is prepared and observed by TEM or the like in many cases. The need for nondestructive inspection is increasing because it takes time and cost to prepare a sample for cross-sectional observation and because of a destructive inspection.

As one of the non-destructive inspection methods, there is an inspection method using SEM. Regarding the inspection/measurement method using SEM, the following methods are disclosed in respective patent documents.

For example, JP 2017-062174 A discloses a method of determining an edge shape and a side wall shape by changing the energy of accelerating electrons and measuring the change in the position of an edge peak.

JP 2015-106530 A discloses a method of simultaneously detecting a low-angle BSE and SE, or a low-angle BSE and a high-angle BSE to obtain a signal waveform, and detecting the diameter of a hole at an upper portion and a lower portion to monitor a side wall inclination state.

JP 2011-033423 JP discloses a method of estimating a shape by creating a database (library) of SEM signal waveforms and shapes in advance, and comparing the obtained signal waveforms. JP 2013-069693 A discloses a method of obtaining information on a side wall shape by irradiating a charged particle ray while tilting the ray.

SUMMARY OF THE INVENTION

According to the technique disclosed in JP 2017-062174 A, the side wall shape of a pattern can be estimated from an image acquired with a plurality of irradiation energies of a charged particle ray. However, even if the technique according to JP 2017-062174 A is used, shape estimation corresponding to depth cannot be performed. In addition, acquiring an image while changing the irradiation energy requires adjusting a focus of the charged particle ray every time the acceleration of the charged particle ray is changed, which poses problems in measurement throughput and measurement reproducibility. Further, since it is difficult to continuously change the irradiation energy, information may be missed depending on the complexity of the side wall shape such as bowing.

According to the technology disclosed in JP 2015-106530 A, a low-angle BSE and SE, or a low-angle BSE and a high-angle BSE are simultaneously detected to obtain a signal waveform. With this configuration, the diameter of the hole can be detected at the upper part and the lower part, and the side wall inclination state and the like can be monitored. In addition, the diameter of the hole at the upper and lower portions and the side wall inclination can be estimated from only the low-angle BSE signal. In JP 2015-106530 A, the taper angle of the side wall can be estimated for sure from the diameter of the hole bottom and the surface, but it is not actually possible to measure such as bowing, and also the estimation of the side wall inclination angle in the case of a reverse taper is difficult.

According to the technique disclosed in JP 2011-033423 A, a line profile shape acquired by SEM under a plurality of signal acquisition conditions is compared with library data. With this configuration, the cross-sectional shape (side wall angle and the like) can be estimated with high accuracy. The plurality of conditions include irradiation conditions and detection conditions, and the detection conditions include emission direction, energy selection, etc. However, the detectors are limited, and it is necessary to create library data for each device and pattern, thereby complicating a shape estimation process too much.

According to the technique disclosed in JP 2013-069693 JP, a three-dimensional shape can be estimated by observing a sample from an oblique direction using SEM. With respect to a pattern having a forward taper, it is possible to obtain information on the side wall by irradiating a beam obliquely. However, in the case of a high aspect ratio sample, the angle at which the beam is inclined is limited, and a condition that the beam cannot be applied to a reverse tapered pattern is likely to occur.

The present disclosure has been made in view of such a situation, and provides a technique that solves the above-described problem of the related art and easily estimates the cross-sectional shape of a formed pattern.

In order to solve the above problem, the present disclosure provides a technique for estimating a cross-sectional shape of a pattern using an angle discrimination image obtained by separating detected electrons obtained by normal electron ray irradiation by an angle (elevation angle). In one aspect, the present disclosure provides a pattern cross-sectional shape estimation system which includes a charged particle ray device which includes a scanning deflector that scans a charged particle beam emitted from a charged particle source, a detector that detects charged particles obtained based on scanning of the charged particle beam with respect to a sample, and an angle discriminator that is disposed in a front stage of the detector and discriminates charged particles to be detected at an angle, and an arithmetic device that generates a luminance of an image based on an output of the detector, and calculates a signal waveform of a designated region on the image using the luminance. The arithmetic device generates a plurality of angle discrimination images using signal electrons at different detection angles, and estimates a side wall shape of a measurement target pattern based on a change in a pattern dimension calculated from a signal waveform of each angle discrimination image with respect to a detection angle.

Other features of the disclosure will be clear from the description and the accompanying drawings. In addition, embodiments of the disclosure are achieved and realized by elements, combinations of various elements, the following detailed description, and the attached claims.

The description of this specification is given only as a typical example, and does not limit the scope of claims or applications of the disclosure.

According to the present disclosure, it is possible to easily estimate a cross-sectional shape of a formed pattern.

BRIEF DESCRIPTION OF THE DRAWINGS

FIGS. 9A to 9C are diagrams illustrating a change in a dimensional ratio with respect to a detection angle at each threshold value in each groove pattern;

FIGS. 10A to 10C are diagrams illustrating a configuration example of a signal electronic aperture 110 used for performing elevation angle discrimination using the signal electronic aperture 110 and the signal electronic deflector 107;

DESCRIPTION OF THE PREFERRED EMBODIMENTS

Figure 1:
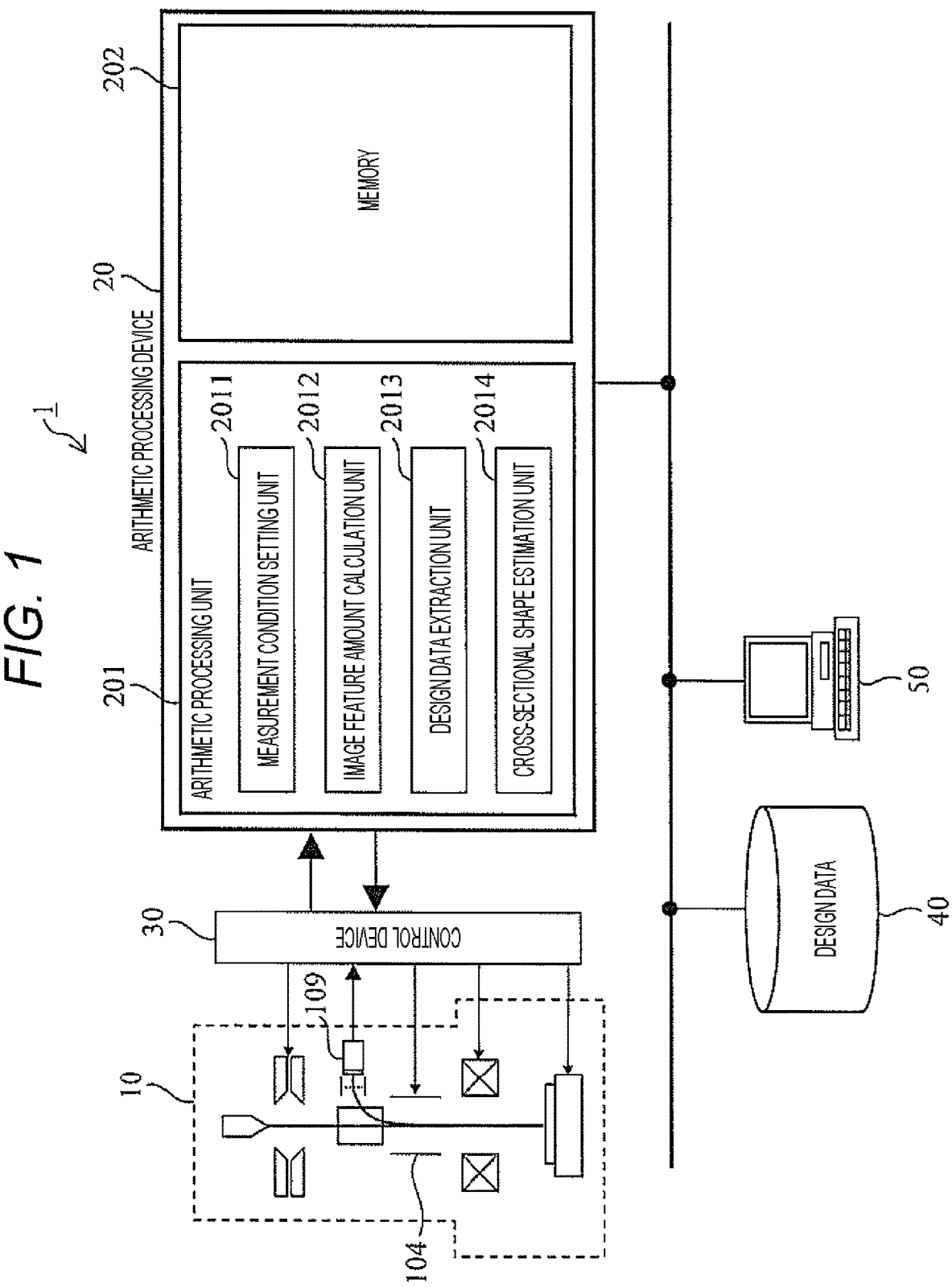
FIG. 1 is a diagram illustrating a schematic configuration example of a semiconductor measurement system (also referred to as a cross-sectional shape estimation system) 1 according to an embodiment.

This embodiment relates to a technique for estimating a three-dimensional shape of a pattern (a fine pattern of a semiconductor device) based on a change in signal waveforms of a plurality of angle discrimination images from which electrons having a specific angular width have detected. For example, with the use of an angle discrimination image in which detected electrons obtained by ordinary electron ray irradiation are separated by an angle (elevation angle), the cross-sectional shape of the pattern can be easily estimated.

As a device for measuring and inspecting a fine pattern of a semiconductor device with high accuracy, a need for a scanning electron microscope is increasing. The scanning electron microscope is a device that detects electrons emitted from a sample, generates a signal waveform by detecting such electrons, and measures, for example, a dimension between peaks (pattern edges). In recent years, with the miniaturization of semiconductor devices, there is a trend of device structures such as FinFET and Nanowire becoming more complicated. Along with the above, the number of cases in which the state of the side wall of the pattern affects the electrical characteristics of the device has increased, and the importance of a side wall shape management during process development and mass production has increased.

On the other hand, it is difficult to determine the side wall shape using the Top-View image by the scanning electron microscope (for example, in a case where the side wall of the pattern has a reverse taper, the electron ray is not directly applied to the side wall). For this reason, a destructive inspection in which a cross section is divided to confirm a pattern shape by TEM or the like is employed. Further, as the device structure described above becomes more complicated, the need for confirming the cross-sectional shape of the pattern is increasing, and there is a problem that the development period and the cost by observing the cross-sectional shape are increasing.

In order to cope with such a problem, in this embodiment described below, the description will be given about a technology that the cross-sectional shape (a cross-sectional shape in the depth direction) of the pattern is non-destructively estimated using a Top-View image by a scanning electron microscope, and the estimated cross-sectional shape is presented to the operator.

Specifically, the description will be given about a semiconductor measurement system which includes a scanning deflector that scans a charged particle beam emitted from a charged particle source, a signal electronic aperture and a signal electron focusing lens for discriminating an angle of an electron to be detected, a control unit for controlling a voltage or a current to focus electrons, a detector for detecting charged particles obtained based on scanning of the charged particle beam on a sample, and an arithmetic device which generates a luminance of an image based on an output of the detector and calculates a luminance ratio of a region designated on an image using the luminance. Taper angle information (cross-sectional shape) in each depth of a pattern is estimated from an amount of change in dimension of a signal waveform with respect to an angle of a detected electron using a plurality of angle discrimination images in which different signal electrons are detected. According to such a configuration, even in Top-View observation by SEM, the taper shape, the taper angle (forward taper, reverse taper, bowing, etc.) can be estimated by evaluating the tendency of the change in the dimensional value of the signal waveform with respect to the detection angle. In this embodiment, the estimation of the cross-sectional shape of an L & S (Line & Space) pattern of Si is mainly described, but the invention is not limited to this pattern.

Configuration Example of Semiconductor Measurement System

FIG. 1 is a diagram illustrating a schematic configuration example of a semiconductor measurement system (also referred to as a cross-sectional shape estimation system) 1 according to this embodiment.

The semiconductor measurement system 1 includes a scanning electron microscope (SEM) 10, which is a type of charged particle ray device, an arithmetic processing device 20, a control device 30 for controlling the scanning electron microscope 10, a design data storage device 40 for storing design data, and an input/output device 50.

The control device 30 controls each component of the scanning electron microscope 10, and also has a function of forming an image based on the detected electrons, a function of deriving an edge position of a pattern from each image, and a function of deriving the amount of change in the edge position between a plurality of images.

The arithmetic processing device 20 includes an arithmetic processing unit 201 which supplies a predetermined control signal to the control device 30 or executes a signal processing of a signal obtained by the scanning electron microscope 10, and a memory (storage device) 202 which stores the obtained image information and recipe information. Further, in this embodiment, the control device 30 and the arithmetic processing device 20 are configured as separate components, but may be configured as an integrated control device (arithmetic device).

Electrons emitted from the sample by the beam scanning by the deflector (scanning deflector) 104 or electrons generated by a conversion electrode are captured by a detector 109 and a detector 113 (see FIG. 2 for 113), and are converted into a digital signal by an A/D converter (not illustrated) built in the control device 30. Then, the digital signal is subjected to image processing according to the purpose by image processing hardware such as a CPU, an ASIC, and an FPGA (not illustrated) incorporated in the arithmetic processing device 20.

The arithmetic processing unit 201 includes a measurement condition setting unit 2011 that sets measurement conditions such as scanning conditions of the deflector 104 based on the measurement conditions input by the input/output device 50, and an image feature amount calculation unit 2012 that calculates a profile in an ROI (Region Of Interest) input (designated) by the input/output device 50 from the image data obtained by the scanning electron microscope 10.

In addition, the arithmetic processing unit 201 includes a design data extraction unit 2013 which reads design data from the design data storage device 40 according to the conditions input by the input/output device 50, and converts vector data into layout data as needed, and a cross-sectional shape estimation unit 2014 which estimates the cross-sectional shape of the pattern based on the signal waveform of the acquired angle discrimination image.

The cross-sectional shape estimation unit 2014 calculates signal waveforms of a plurality of regions specified by the operator from each angle discrimination image obtained by the image feature amount calculation unit 2012. In addition, the cross-sectional shape estimation unit 2014 derives an estimated pattern cross-sectional shape from a change in dimensional value of the signal waveform with respect to the detection angle.

The input/output device 50 connected to the arithmetic processing device 20 via a network includes a display device, and displays a GUI on the display screen of the display device for displaying an image and an estimated cross-sectional shape to the operator. For example, the estimated cross-sectional shape can be displayed as a three-dimensional map together with image data and design data.

Configuration Example of Scanning Electron Microscope

Figure 2:
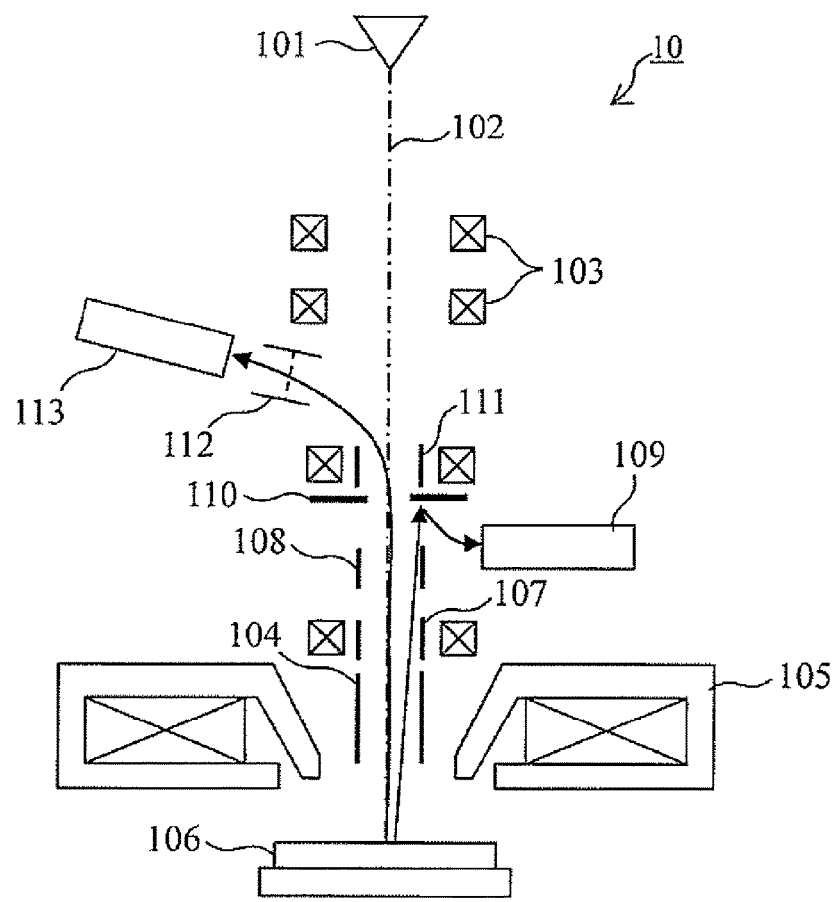
FIG. 2 is a diagram illustrating a schematic configuration example of a scanning electron microscope (SEM) 10 which is a kind of a charged particle ray device according to the embodiment.

FIG. 2 is a diagram illustrating a schematic configuration example of the scanning electron microscope (SEM) 10 which is a kind of a charged particle ray device according to this embodiment.

The scanning electron microscope (SEM) 10 includes an electron gun (electron source) 101, a condenser lens 103, a deflector (scanning deflector) 104, an objective lens 105, a signal electronic deflector 107, and a signal electron focusing lens 108, the detector (first detector) 109, a signal electronic aperture 110, a signal electronic deflector 111, an energy filter 112, the detector (second detector) 113, and a sample stage 115.

The condenser lens 103 focuses the electron ray 102 (electron beam) generated by the electron gun 101. Finally, the objective lens 105 focuses the electron ray 102 on the sample 106. The deflector 104 (scanning deflector) scans the electron ray 102 over an electron ray scanning region of the sample 106. When the electron ray 102 (primary electron) is two-dimensionally irradiated and scanned on the sample 106, the irradiation excites electrons in the sample 106 and emits signal electrons 114 from the sample 106.

The detector 109 and the detector 113 detect the emitted signal electrons 114. By converting the detected signal electrons into an image, it becomes possible to observe and measure the sample. The signal electrons 114 emitted from the sample 106 are separated into electrons that pass through the signal electronic aperture 110 and electrons that collide through the signal electronic deflector 107 and the signal electron focusing lens 108.

The electrons that collide with the signal electronic aperture 110 generate tertiary electrons, and the electrons (tertiary electrons) are detected by the detector (first detector) 109. The electrons that have passed through the signal electronic aperture 110 are deflected to the detector (second detector) 113 through the signal electronic deflector 111. In the front stage of the detector (second detector) 113, the energy filter 112 capable of discriminating signal electrons by energy is provided, and the electrons passing through the filter are detected by the detector (second detector) 113.

The signal electron focusing lens 108 controls the spread (convergence) of the signal electrons 114. In addition, the signal electronic aperture 110 separates the signal electrons 114 by an angle. With these two components, a function of controlling the angle of the signal electrons 114 is realized. The signal electronic aperture 110 has a hole on the optical axis (along the optical axis). By controlling the spread of the signal electrons by the signal electron focusing lens 108, the angle of the electrons passing through the hole provided in the signal electronic aperture 110 can be adjusted.

The control device 30 (see FIG. 1) connected to the scanning electron microscope 10 controls the optical elements 103, 104, 105, and 107 of the scanning electron microscope 10, controls the signal electron focusing lens 108, and controls the voltage applied to the energy filter 112. The signal electron focusing lens 108 may be either an electrostatic lens or a magnetic lens. In addition, a negative voltage application power source (not illustrated) is connected to the sample stage 115 for mounting the sample 106, and the control device 30 controls the negative voltage application power source to control energy reaching to the sample of the electron beam.

Further, the invention is not limited to this embodiment, and the energy that the electron beam reaches the sample may be controlled by controlling an acceleration power source connected between an acceleration electrode for accelerating the electron ray 102 and the electron source. Further, the scanning electron microscope 10 illustrated in FIG. 2 includes an image memory (not illustrated) that stores a detection signal for each pixel, and stores the detection signal in the image memory.

The arithmetic processing device 20 connected to the scanning electron microscope 10 estimates the cross-sectional shape of the pattern based on the image data stored in the image memory of the scanning electron microscope 10. More specifically, for each condition discriminated by the detection angle, a signal waveform of a region designated by the operator is calculated based on luminance information stored in each pixel of the image, and a pattern dimension is derived from the signal waveform. Thereafter, a taper angle at each depth is estimated from a change in dimension of the signal value with respect to the detection angle. At this time, the structure of the pattern may be estimated by comparing the obtained result with experimental data having a known structure or an electron ray diffusion simulation result such as a Monte Carlo method.

Example of Pattern of Estimative Cross-Sectional Shape

Figure 3:
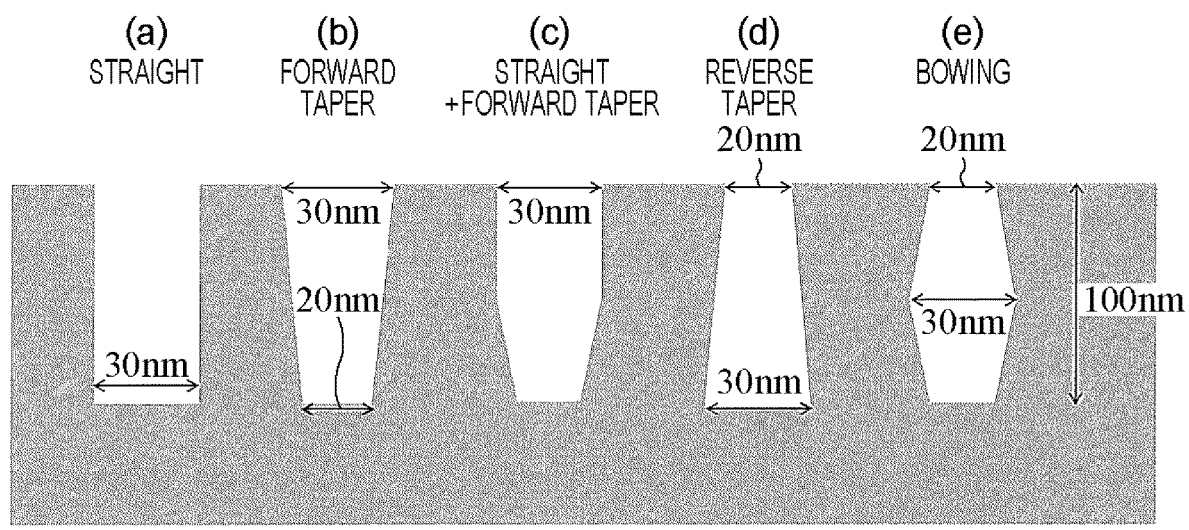
FIG. 3 is a diagram illustrating an example of a pattern having a cross-sectional shape estimated according to the embodiment.

FIG. 3 is a diagram illustrating an example of a pattern having a cross-sectional shape estimated according to this embodiment. Further, the cross-sectional shape estimation is not limited to the pattern example illustrated in FIG. 3.

FIG. 3 illustrates five types of patterns. In this embodiment, the groove pattern made of Si is targeted, and the shape of the side wall is used as a parameter. (a) of FIG. 3 is a straight shape, (b) of FIG. 3 is a forward taper, (c) of FIG. 3 is a combination of a straight and a forward taper, (d) of FIG. 3 is a reverse taper, and (e) of FIG. 3 is a bowing shape, respectively.

The size of the pattern is as illustrated in FIG. 3, and the shape has been changed from the intermediate depth of 50 nm in (c) and (e) of FIG. 3. The cross-sectional shape estimation in the above five types of patterns will be described.

An electron ray diffusion simulation of irradiating each pattern with 5 keV primary electrons has been performed. The electrons emitted from the sample 106 are separated by the signal electronic aperture 110, and the signal electrons are detected by the detectors 109 and 113, respectively, whereby the signal waveforms illustrated in FIG. 4 are obtained.

Figure 4:
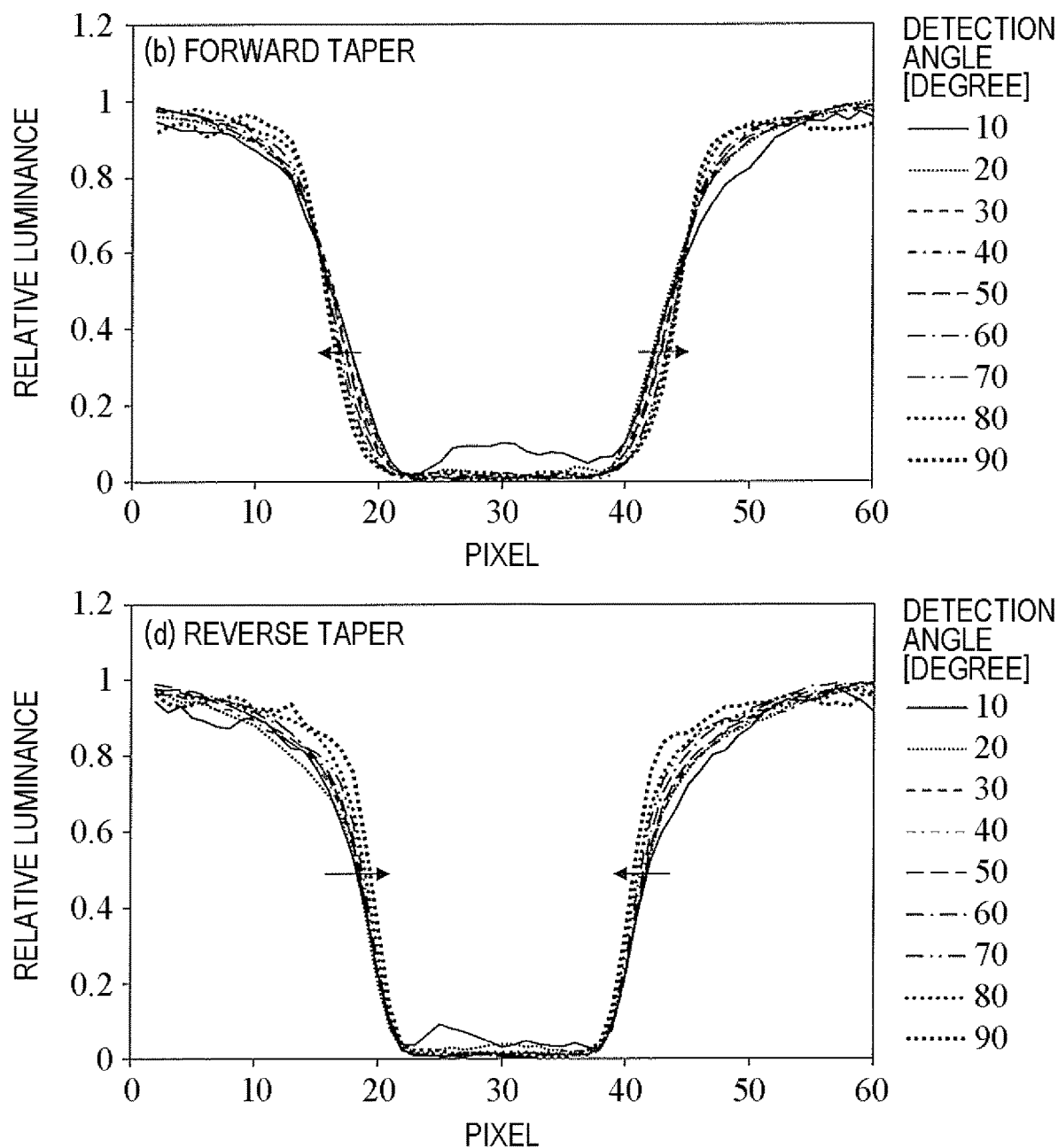
FIG. 4 is a diagram illustrating signal waveforms obtained from a forward tapered shape and a reversed tapered shape.

FIG. 4 is a diagram illustrating signal waveforms obtained from the forward tapered shape and the reversed tapered shape. The signal waveform is obtained by separating the elevation angles of the detected electrons at 0 to 10 degrees, 10 to 20 degrees, and every 10 degrees. The elevation angle is an angle with respect to the optical axis (+z), and the elevation angle of the signal electrons emitted from the sample 106 directly (vertically) is 0 degree. Further, since the emission amount varies depending on the angle, the vertical axis of FIG. 4 standardizes the luminance of each signal waveform with a maximum luminance.

Referring the signal waveform in FIG. 4, in the case of a forward taper (the upper drawing in FIG. 4), it can be seen that the waveform of the groove is shifted outward as the detection angle increases (signal electrons in the horizontal direction is detected). On the other hand, in the case of a reverse taper (the lower drawing in FIG. 4), it can be seen that the groove waveform shifts inward as the detection angle increases, and the detection angle reflects the shape of the taper.

Figure 5:
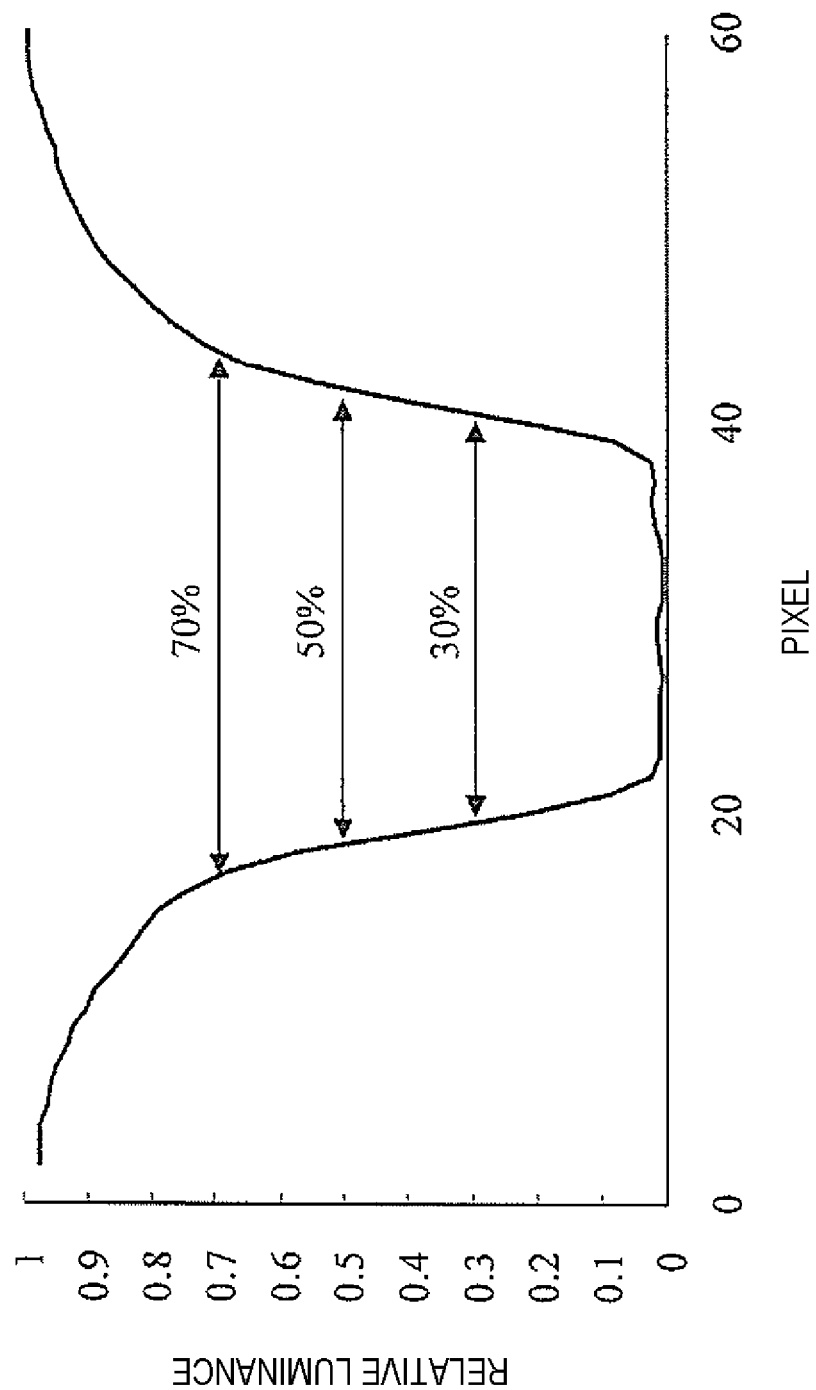
FIG. 5 is a diagram illustrating threshold values when dimensions are derived.

Therefore, for the five types of patterns in FIG. 3, a change in dimension of the signal value with respect to the detection angle is obtained. As illustrated in FIG. 5, when the maximum luminance of each signal waveform is set to 100% and the minimum luminance is set to 0%, the dimensions of the signal values are evaluated at threshold values of 30%, 50%, and 70%. If the value is too close to 100% or 0%, the noise component may increase. Therefore, the places of 30%, 50%, and 70% are evaluated, but the invention is not limited thereto as long as the dimension of the signal value can be stably evaluated.

<Dimensional Change of Each Pattern to Detection Angle: Principle of Side Wall Shape Estimation>

Figure 6A:
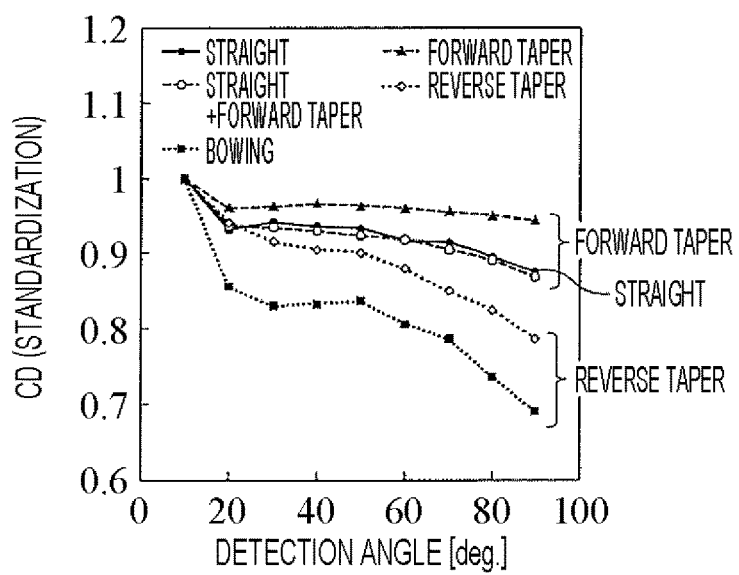
FIGS. 6A to 6C are diagrams illustrating a dimensional change of a signal value of each pattern with respect to a detection angle.
Figure 6B:
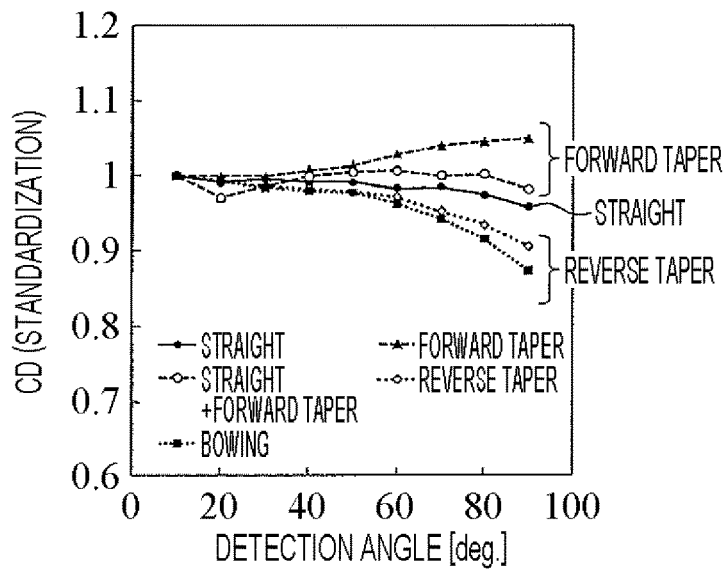
Figure 6C:
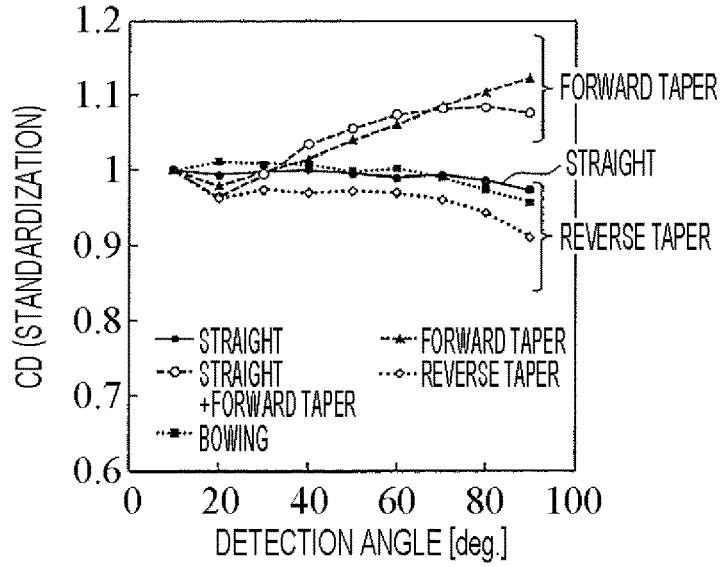

FIGS. 6A to 6C are diagrams illustrating a dimensional change of the signal value of each pattern with respect to the detection angle. In this embodiment, the dimension of the elevation angle of 0 to 10 degrees is used as a reference, and the dimensional change of the signal value therefrom is evaluated for each threshold value (a dimensional change of the signal values indicating the luminance values of 70%, 50%, 30% is evaluated: the dimension of the signal value can be calculated by measuring the number of pixels included at the position of the luminance value of 70% and by Number of Pixels×Dimension of One Pixel). FIGS. 6A to 6C are graphs obtained by plotting the dimensions of the signal values obtained by changing the elevation angle of the emitted signal electrons 114 from 10 degrees to 90 degrees by the signal electronic aperture 110.

The change in dimension of the signal value differs depending on the shape of the pattern. Referring FIGS. 6A to 6C, it can be seen that the way of changing the dimension of the signal value differs when the luminance value is 70%, 50%, and 30%. Specifically, when the straight is set as a reference, there is a tendency that the dimension increases in the forward taper and decreases in the reverse taper.

Further, the change differs depending on the threshold value for evaluating the dimension. In 70% of FIG. 6A, the tendency of the change of (i) straight and (iii) straight+ forward taper is almost the same. On the other hand, in 30% of FIG. 6C, the change in (ii) forward taper and the change in (iii) straight+forward taper are almost equal. Also for the reverse taper, in 70% of FIG. 6A, the dimension reduction width is larger in (v) bowing with a larger taper angle than in (iv) reverse taper. On the other hand, in 30% of FIG. 6C, the tendency of (iv) reverse taper and (v) bowing dimensional reduction is reversed, and the dimensional change is almost straight.

FIGS. 6A to 6C illustrate that the actual pattern change illustrated in FIG. 3 appears in the change in dimensional value when the length is measured while changing the threshold value. Therefore, by sweeping the detection angle of the signal electrons and sweeping the threshold value when deriving the dimensional value from the signal waveform, it is possible to estimate the side wall shape including the depth direction.

<Details of Pattern Cross-Sectional Shape Estimation Processing>

Figure 7:
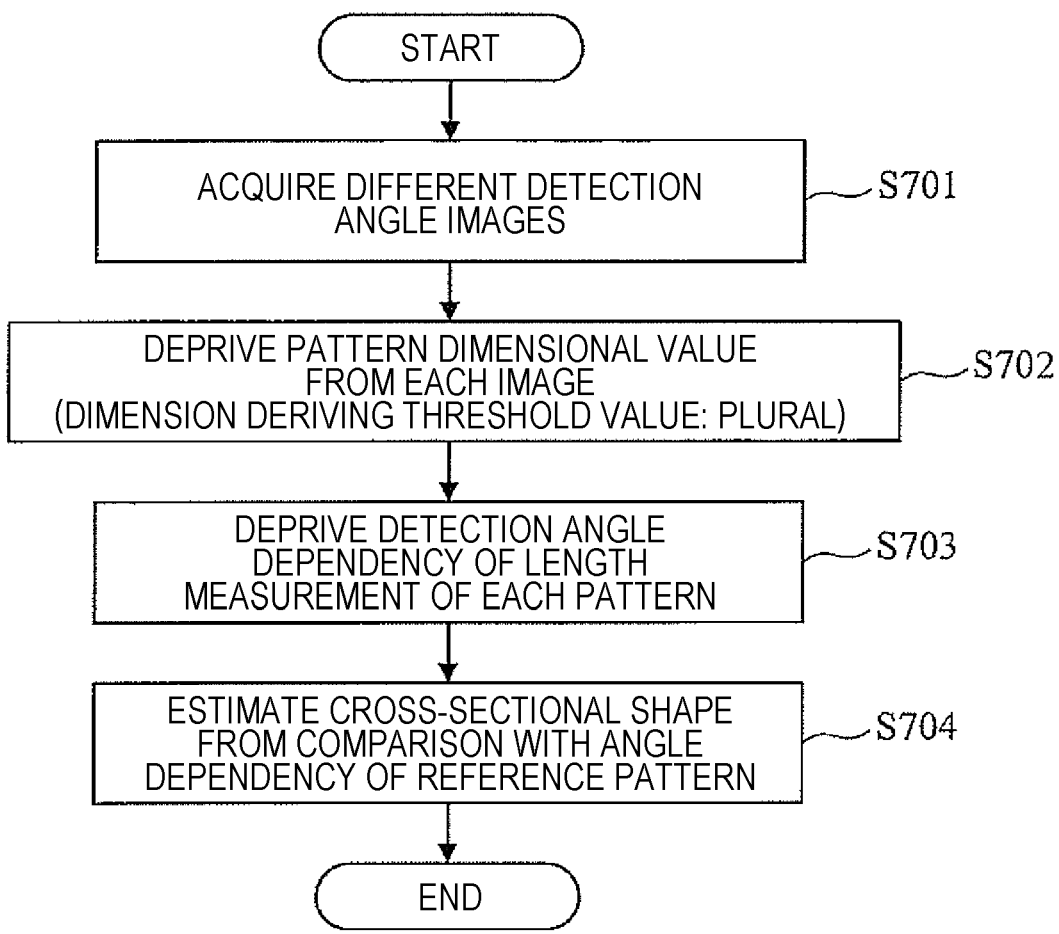
FIG. 7 is a flowchart for describing details of a pattern cross-sectional shape estimation process according to the embodiment.

FIG. 7 is a flowchart for describing details of the pattern cross-sectional shape estimation processing according to this embodiment.

(i) Step 701

The control device 30 controls the scanning electron microscope 10, acquires an image (signal) at different detection angles (by changing the elevation angle of the signal electron), and transfers the acquired image (signal) to the arithmetic processing device 20.

The control device 30 changes the detection angle (the elevation angle of the signal electrons emitted from the sample 106) by, for example, 10 degrees from 0 degrees to 90 degrees by controlling the voltage applied to the signal electron focusing lens 108. In a case where the elevation angle is too small (for example, from 0 to 10 degrees), the electrons emitted from the sample 106 are not reflected by the signal electronic aperture 110 (the spread of the electrons is not enough, and all the electrons pass through the hole of the signal electronic aperture 110), and the signal electrons detected by the detector (first detector) 109 disappear. In this case, an image is formed using only the signal electrons detected by the detector (second detector) 113. The detectors 109 and 113 acquire information on brightness corresponding to the location on the sample 106 where the electron ray 102 has been irradiated.

Further, the measurement conditions such as the applied voltage value and the scanning width to various deflectors and various lenses are input by the user (operator) from the input/output device 50, for example. Then, the measurement condition setting unit 2011 can be configured to instruct the control device 30 to control the scanning electron microscope 10 based on the input measurement conditions.

(ii) Step 702

From each image corresponding to a different detection angle, the image feature amount calculation unit 2012 derives a dimensional value of a place where the luminance value is a predetermined value (for example, 30%, 50%, and 70%: threshold values are not necessarily set for these values, and three or more threshold values may be set) when the maximum luminance of the image signal waveform is set to 100% and the minimum luminance to 0% (see FIG. 5).

(iii) Step 703

The image feature amount calculation unit 2012 derives a detection angle dependency (characteristic illustrated in FIGS. 6A to 6C) of the length measurement of each target pattern (for example, straight, forward taper, straight+forward taper, reverse taper, or bowing illustrated in FIG. 3). At this point, since the shape of the pattern is unknown, for example, in a case where the pattern is a forward taper, a characteristic (similarity) corresponding to the specification of the forward taper illustrated in FIGS. 6A to 6C is obtained.

(iv) Step 704

The image feature amount calculation unit 2012 compares the angle-dependent characteristic (angle dependency) acquired in Step 703 with a reference pattern (for example, the angle-dependent characteristic of a straight pattern stored in the memory 202 in advance), and estimates the cross-sectional shape of the target pattern. For example, in a case where the target pattern is a forward taper+straight pattern, the angle-dependent characteristics of all positions (70%, 50%, 30%) are compared with the angle-dependent characteristics of the straight pattern. Then, it can be determined that at which position (70%) the characteristics are the same as those of the straight pattern, and at which position (50% and 30%) the characteristics are different from those of the straight pattern.

Further, the shape can be estimated without the reference pattern (reference). However, in a case where there is data of the dimensional change with respect to the detection angle in the known pattern such as the reference pattern, the cross-sectional shape can be easily estimated from the comparison.

<Estimation of Taper Angle>

The tapered portions included in the pattern can be formed at different angles. Therefore, it may be necessary to estimate the angle of the tapered portion. Therefore, in this embodiment, as an example, the taper angle is estimated from the tendency of the change in the dimensional value with respect to the sweep of the detection angle.

Figure 8:
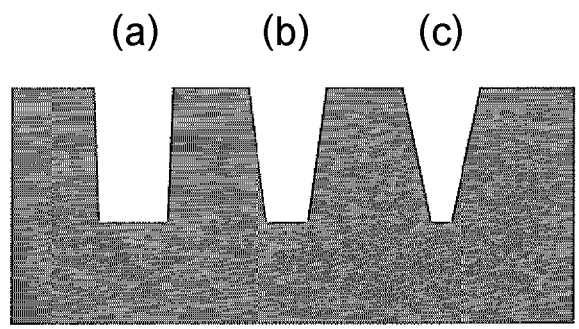
FIG. 8 is a diagram illustrating an example of a forward tapered groove pattern.

The description will be given using a pattern in which the dimension of a groove entrance as illustrated in FIG. 8 is the same, but the taper angle is different. (a), (b) and (c) of FIG. 8 illustrate of forward tapered groove patterns. In the groove patterns illustrated in (a), (b), and (c) of FIG. 8, the tendency of the dimensional change with respect to the detection angle is the same, but the degree (slope) of the dimensional change is different.

FIGS. 9A to 9C are diagrams illustrating a change in a dimensional ratio with respect to a detection angle at each threshold value in each groove pattern. It can be seen that even with the same forward taper pattern, the slope of the change in the dimensional ratio change with respect to the detection angle is different. In other words, the slope of the change in the dimensional ratio depends on the emission angle distribution of BSE emitted by scattering in the pattern, and the emission angle distribution of BSE depends on the taper angle of the pattern. Therefore, in each pattern, the taper angle of the pattern can be estimated by evaluating the slope of the change in the dimensional ratio with respect to the threshold value.

Specifically, the taper angle can be estimated by acquiring, as a reference, the slope of the change in the dimensional ratio with respect to the threshold value in a pattern with a known taper angle. Further, as the reference, a dimensional change by a Monte Carlo simulation performed by changing the shape may be used. At this time, since the emission angle distribution of BSE changes depending on the scattering state in the sample, it is necessary to prepare the reference according to observation conditions (acceleration) and a material for forming a pattern.

Configuration Example of Signal Electronic Aperture

As described above, the elevation angle discrimination can be realized by, for example, a combination of the signal electron focusing lens 108 for controlling the spread of the signal electrons and the signal electronic aperture 110. On the other hand, it is also possible to perform elevation angle discrimination using the signal electronic aperture 110 and the signal electronic deflector 107 without using the signal electron focusing lens 108. In this case, discrimination is possible by changing the shape of the hole of the signal electronic aperture.

FIGS. 10A to 10C are diagrams illustrating a configuration example of the signal electronic aperture 110 used when performing elevation angle discrimination using the signal electronic aperture 110 and the signal electronic deflector 107. FIG. 10A illustrates an aperture formed with a circular aperture hole, and FIG. 10B illustrates an aperture formed with a vertically long aperture hole (when the vertical direction in the drawing is defined as vertical), FIG. 10C illustrates an aperture formed with an aperture hole that is horizontally long (when the horizontal direction in the drawing is defined as horizontal).

In the configuration example illustrated in FIG. 2, the signal electrons 114 pass through the signal electronic aperture 110 while having distributions of azimuth and elevation angle, and the spread of the elevation angle can be controlled by the signal electron focusing lens 108. For this reason, in order to discriminate by an elevation angle, the aperture may be circular (FIG. 10A: used when acquiring information on elevation angles in all directions).

On the other hand, when utilizing the signal electronic deflector 107 without using the signal electron focusing lens 108, it is necessary to detect only a signal at a specific azimuth. The signal electronic deflector 107 cannot change the convergence of the trajectory, and can only shift the arrival position. Therefore, in order to detect a specific elevation angle, it is necessary to limit the azimuth. Therefore, it is necessary to provide an aperture that allows only signals in specific azimuth as illustrated in FIGS. 10B and 10C to pass through. At the time of elevation angle discrimination, the trajectory of the signal electrons 114 is deflected with respect to the longitudinal direction of the signal electronic aperture 110.

Further, since the azimuth of the emitted electrons may be restricted depending on the shape of the pattern, a plurality of signal electronic apertures may be prepared and switched mechanically. In addition, one signal electronic aperture 110 may be controlled by a rotation mechanism.

Figure 11:
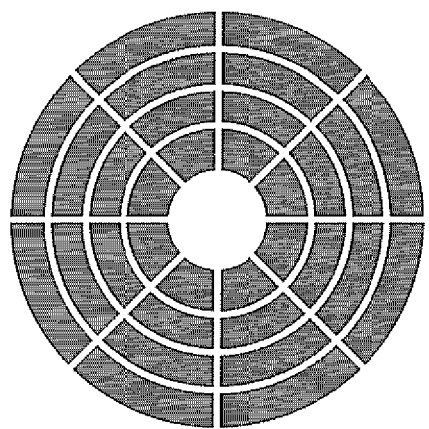
FIG. 11 is a diagram illustrating a configuration example of a direct detector divided in a circumferential direction and a radial direction.

Hitherto, the description has been given about the hardware configuration that restricts the elevation angle of the detected electrons by controlling the trajectory of signal electrons. However, it is also possible to provide a plurality of detectors to acquire an image with one measurement. For example, the direct detectors divided in the circumferential direction and the radial direction as illustrated in FIG. 11 are arranged at the position of the signal electronic aperture 110 in FIG. 1, and a signal in each region can be detected simultaneously. In addition, even in a case where the detector is not a direct detector, it is possible to control a signal region entering the detector (first detector) 109 by applying a voltage to each region. For example, a signal of a specific region can be cut by applying a+potential and trapping tertiary electrons emitted by collision of signal electrons.

In other words, the signal electrons 114 collide with the direct detector and generate tertiary electrons. However, if a voltage is applied to each region of the direct detector and control the tertiary electrons only from the negative electrode, a brightness signal can be obtained only from a specific location. Further, the direct detector may be disposed at that location instead of the signal electronic aperture 110, or may be disposed at that location instead of the detector (second detector) 113 (the detector (first detector) 109 and the signal electronic aperture 110). In addition, if the direct detector is provided, it is not necessary to change the shape of the signal electronic aperture 110.

Figure 12:
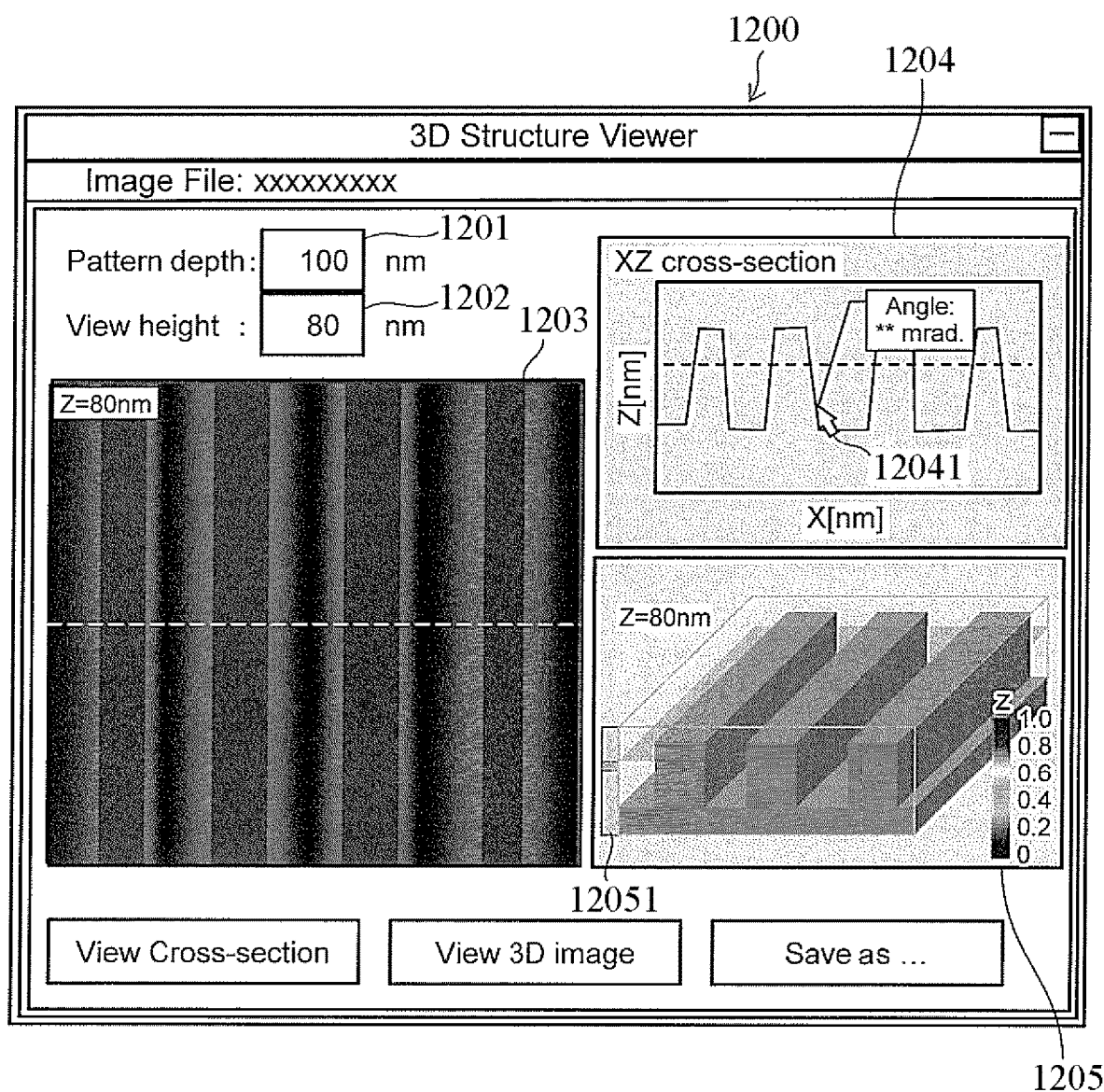
FIG. 12 is a diagram illustrating a configuration example of a GUI screen displaying a cross-sectional shape of an estimated pattern.

Configuration Example of GUI Screen for Displaying Estimated Pattern Cross-Sectional Shape FIG. 12 is a diagram illustrating a configuration example of a GUI screen that displays a cross-sectional shape of an estimated pattern. The operator sets pattern depth information (pattern depth) 1201 on a GUI 1200. In addition, the operator can display an XY cross-sectional image at an arbitrary height by specifying a height (view height) 1202 at which the image is displayed. In this case, the SEM image (Top View) is displayed in a left region 1203 of FIG. 12. At this time, the cross-sectional shape of the region (broken line) designated in the left SEM image is illustrated in the upper right region 1204 of FIG. 12. Then, the operator can display the taper angle at an arbitrary location by moving a mouse cursor 12041 to the upper right cross-sectional profile.

In addition, as in the lower right region 1205 in FIG. 12, the entire image can be three-dimensionally displayed. The operator can arbitrarily rotate the three-dimensional image using a mouse or the like, and can freely change the setting of the display direction. Further, the operator can change the designation of the height (View Height) from the right lower three-dimensional image using a mouse. For example, a bar 12051 on the left side in the right lower diagram may be designated by adjusting with a mouse, and the designated height may be reflected on the XY cross-sectional image. In addition, the created image and the cross-sectional shape profile may be stored with a name.

CONCLUSIONS (i) In this embodiment, the charged particles emitted from the sample are discriminated at a predetermined angle using an angle discriminator, the signal electrons subjected to the angle discrimination are detected by a detector, and a plurality of angle discrimination images are generated by using signal electrons having different detection angles. The side wall shape of the pattern to be measured is estimated based on a change in the pattern dimension calculated from the signal waveform of each angle discrimination image with respect to the detection angle. With this configuration, it becomes possible to grasp the side wall shape of the pattern to be measured without breaking the wafer. In addition, since the shape is estimated using the information obtained by the angle discrimination, the device configuration is not complicated, and the cost for configuring the system can be reduced.

(ii) In this embodiment, the side wall shape estimation processing of the pattern to be measured is executed in the arithmetic processing device 20, but the processing may be shared by a plurality of processors or computers, or some physical configurations (for example, database or the like) may be connected to the arithmetic processing device 20 via a network.

(iii) The functions of this embodiment may be realized by a software program code. In this case, a storage medium for storing the program code is provided in a system or a device. A computer (CPU or MPU) of the system or the device reads out the program code stored in the storage medium. In this case, the program code itself read out of the recording medium is used to realize the functions of the above embodiments. The program code itself and the storage medium storing the program code is configured in this embodiment. As a storage medium to supply such a program code, for example, there are a flexible disk, a CD-ROM, a DVD-ROM, a hard disk, an optical disk, a magneto-optical disk, a CD-R, a magnetic tape, a nonvolatile memory card, and a ROM.

In addition, on the basis of a command of the program code, some or all of the actual processes may be performed by an OS (operating system) running on a computer, and the functions of the embodiments described above may be realized by the process. Further, after the program code read out of the storage medium is written in the memory on the computer, the CPU of the computer may perform some or all of the actual processes on the basis of the command of the program code, and the functions of this embodiment may be realized by the process.

Further, the software program code for realizing the functions of this embodiment is distributed through a network to be stored in a storage unit such as a hard disk and a memory of the system or the device or a storage medium such as CD-RW and CD-R. At the time of operation, the computer (or CPU and MPU) of the system or the device may read out and perform the program code stored in the storage unit or the storage medium.

Finally, the process and the technology described herein are not limited to a specific device in principle, and may be applied in any combination according to components. Further, various types of general-purpose devices may be used according to the content described herein. A dedicated device may be constructed to perform the steps of the method described herein. In addition, a plurality of components disclosed in this embodiment may be appropriately combined. For example, some of the components may be removed from the components of this embodiment. Further, the components of different embodiments may be appropriately combined.

Further, in this embodiment, only control lines and information lines considered to be necessary for explanation are illustrated, but not all the control lines and the information lines for a product are illustrated. All the configurations may be connected to each other.

What is claimed is:

1. A pattern cross-sectional shape estimation system, comprising:
    a charged particle ray device which includes a scanning deflector that scans a charged particle beam emitted from a charged particle source, a signal electron focusing lens and a signal electronic aperture that are controlled to perform discrimination of signal electrons emitted from a sample based on their angle, where the signal electron focusing lens controls a spread of signal electrons and the signal electronic aperture that restricts a detection angle of the signal electrons, and at least one detector that detects the signal electrons at different detection angles; and
    an arithmetic device that generates a luminance of an image based on an output of the at least one detector, and calculates a signal waveform of a designated region on the image using the luminance,
    wherein the arithmetic device generates a plurality of angle discrimination images using signal electrons at the different detection angles, and estimates a side wall shape of a measurement target pattern based on a change in a pattern dimension calculated from a signal waveform of each angle discrimination image with respect to each of the different detection angles.

2. The pattern cross-sectional shape estimation system according to claim 1,
    wherein the arithmetic device estimates a cross-sectional shape in a depth direction of the measurement target pattern from a change in a dimensional value obtained with a different threshold value for a signal waveform of each of the angle discrimination images.

3. The pattern cross-sectional shape estimation system according to claim 1,
    wherein the arithmetic device classifies a pattern shape based on an estimation result of the measurement target pattern, and displays information on the pattern shape and information on a taper angle of a taper portion included in the measurement target pattern on a display screen.

4. The pattern cross-sectional shape estimation system according to claim 1,
    wherein the arithmetic device acquires, as a reference, a change in dimension with respect to a detection angle of a known pattern whose cross-sectional shape is known in advance from a storage device, and estimates a shape of the measurement target pattern from a difference between a change of the known pattern and a change in the calculated pattern dimension with respect to a detection angle.

5. A non-transitory computer readable storage medium storing thereon a program for causing a computer to execute a process of estimating a cross-sectional shape of a pattern to be measured,
    wherein the process comprises the steps of:
    performing discrimination of signal electrons emitted from a sample, scanned by a charged particle beam emitted from a charged particle source, based on their angle, by controlling an electron focusing lens and a signal electronic aperture, where the signal electron focusing lens controls a spread of signal electrons and the signal electronic aperture restricts a detection angle of the signal electrons;
    detecting, by at least one detector, the signal electrons at different detection angles;
    generating, by an arithmetic device, a luminance of an image based on an output of the at least one detector;
    calculating, by the arithmetic device, a signal waveform of a designated region on the image using the luminance,
    generating, by the arithmetic device, a plurality of angle discrimination images using signal electrons at the different detection angles; and
    estimating, by the arithmetic device, a side wall shape of a measurement target pattern based on a change in a pattern dimension calculated from a signal waveform of each angle discrimination image with respect to each of the different detection angles.

* * * * *